(12) United States Patent
Choi et al.

(10) Patent No.: US 12,538,645 B2
(45) Date of Patent: Jan. 27, 2026

(54) SURFACE PROTECTIVE FILM AND METHOD FOR MANUFACTURING ORGANIC LIGHT-EMITTING ELECTRONIC DEVICE BY USING SAME

(71) Applicant: LG CHEM, LTD., Seoul (KR)

(72) Inventors: Jeong Min Choi, Daejeon (KR); Hyun Cheol Kim, Daejeon (KR); Sojin Kim, Daejeon (KR); Hyungoo Kang, Daejeon (KR); Jae Seung Lim, Daejeon (KR)

(73) Assignee: Xinmei Fontana Holding (Hong Kong) Limited, Hong Kong (CN)

( * ) Notice: Subject to any disclaimer, the term of this patent is extended or adjusted under 35 U.S.C. 154(b) by 865 days.

(21) Appl. No.: 17/295,792

(22) PCT Filed: Jan. 22, 2020

(86) PCT No.: PCT/KR2020/001110
§ 371 (c)(1),
(2) Date: May 20, 2021

(87) PCT Pub. No.: WO2020/153757
PCT Pub. Date: Jul. 30, 2020

(65) Prior Publication Data
US 2022/0013748 A1 Jan. 13, 2022

(30) Foreign Application Priority Data
Jan. 25, 2019 (KR) .................. 10-2019-0010031

(51) Int. Cl.
*H10K 50/844* (2023.01)
*C09J 7/20* (2018.01)
(Continued)

(52) U.S. Cl.
CPC .............. *H10K 50/844* (2023.02); *C09J 7/20* (2018.01); *C09J 7/24* (2018.01); *C09J 7/255* (2018.01);
(Continued)

(58) Field of Classification Search
None
See application file for complete search history.

(56) References Cited

U.S. PATENT DOCUMENTS 5,814,685 A * 9/1998 Satake .................. C09D 11/326
525/902
7,070,051 B2 * 7/2006 Kanner ............ A61B 17/06133
206/460
(Continued)

FOREIGN PATENT DOCUMENTS

CN 106467710 A 3/2017
JP 2013-247164 A 12/2013
(Continued)

OTHER PUBLICATIONS

KR20170135512A, English Translated, (Year: 2017).*
(Continued)

*Primary Examiner* — Frank D Ducheneaux
(74) *Attorney, Agent, or Firm* — Ricky Lam

(57) ABSTRACT

The present disclosure relates to a surface protective film; and a method for manufacturing an organic light emitting electronic device using the same.

4 Claims, 2 Drawing Sheets

(51) Int. Cl.

| | | |
|---|---|---|
| *C09J 7/24* | (2018.01) | |
| *C09J 7/25* | (2018.01) | |
| *C09J 7/29* | (2018.01) | |
| *C09J 7/40* | (2018.01) | |
| *C09J 175/04* | (2006.01) | |
| *H10K 59/40* | (2023.01) | |
| *H10K 71/00* | (2023.01) | |
| *H10K 59/12* | (2023.01) | |

(52) U.S. Cl.
CPC ............... *C09J 7/29* (2018.01); *C09J 7/40* (2018.01); *C09J 175/04* (2013.01); *H10K 59/40* (2023.02); *H10K 71/00* (2023.02); *B32B 2250/04* (2013.01); *B32B 2250/40* (2013.01); *B32B 2307/21* (2013.01); *C09J 2301/312* (2020.08); *C09J 2433/006* (2013.01); *C09J 2467/006* (2013.01); *C09J 2475/00* (2013.01); *H10K 59/1201* (2023.02)

(56) References Cited

U.S. PATENT DOCUMENTS

| | | |
|---|---|---|
| 2012/0171444 A1 | 7/2012 | Haruta et al. |
| 2014/0030519 A1 | 1/2014 | Morimoto et al. |
| 2015/0037576 A1 | 2/2015 | Kataoka et al. |
| 2017/0299790 A1 | 10/2017 | Ueno et al. |
| 2019/0391312 A1 | 12/2019 | Hikita et al. |
| 2020/0343479 A1 | 10/2020 | Choi et al. |
| 2021/0362482 A1 | 11/2021 | Moon |

FOREIGN PATENT DOCUMENTS

| | | | |
|---|---|---|---|
| JP | 2015518177 A | 6/2015 | |
| JP | 2016-89056 A | 5/2016 | |
| JP | 2017-102443 A | 6/2017 | |
| JP | 2018172611 A | 11/2018 | |
| JP | 2018203873 A | 12/2018 | |
| KR | 10-2007-0119182 A | 12/2007 | |
| KR | 10-2014-0014002 A | 2/2014 | |
| KR | 10-2014-0017176 A | 2/2014 | |
| KR | 10-2015-0015397 A | 2/2015 | |
| KR | 10-2016-0101507 A | 8/2016 | |
| KR | 10-2017-0063656 A | 6/2017 | |
| KR | 10-2017-0092710 A | 8/2017 | |
| KR | 10-2017-0135512 A | 12/2017 | |
| KR | 20170135512 A | * 12/2017 | ............... G02B 1/14 |
| KR | 10-2019-0045084 A | 5/2019 | |

OTHER PUBLICATIONS

Machine translation of KR-2017135512-A (Year: 2017).*
Machine translation of JP-2018203873-A (Year: 2018).*
Aldrich Data Sheet (Year: 2019).*

* cited by examiner

[Figure 1]
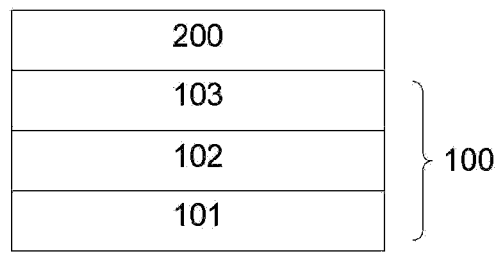
[Figure 2]
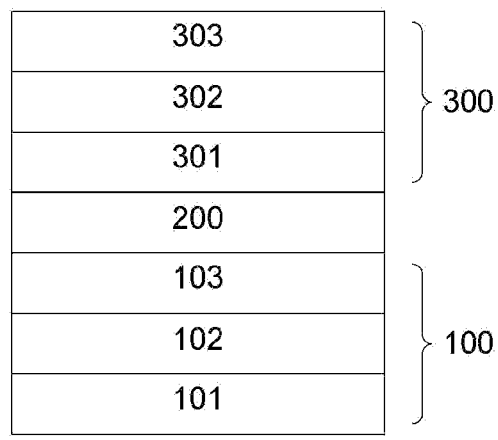
[Figure 3]
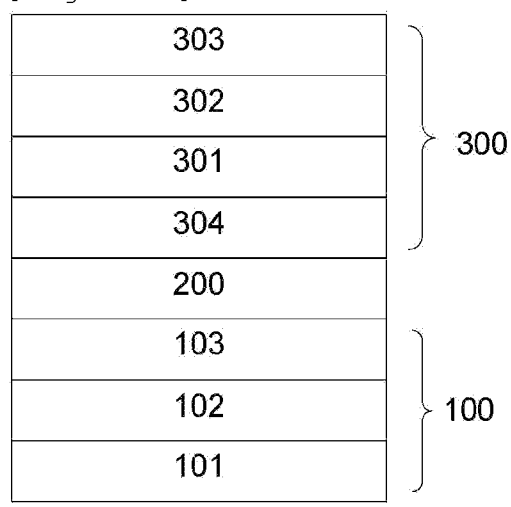

[Figure 4]
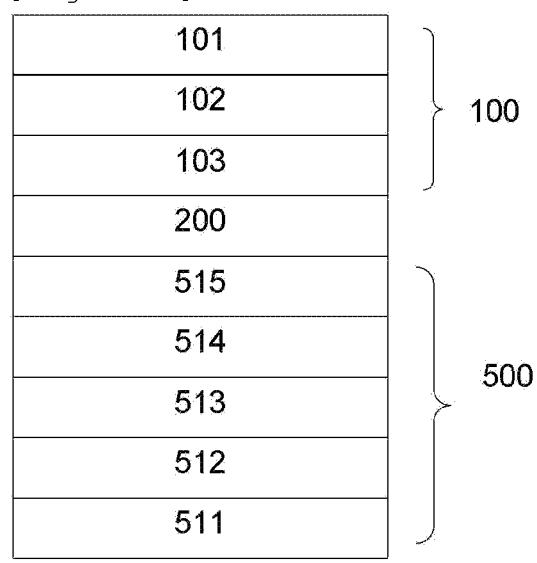

SURFACE PROTECTIVE FILM AND METHOD FOR MANUFACTURING ORGANIC LIGHT-EMITTING ELECTRONIC DEVICE BY USING SAME

CROSS-REFERENCE TO RELATED APPLICATIONS

This application is a National Phase entry pursuant to 35 U.S.C. § 371 of International Application No. PCT/KR2020/001110 filed on Jan. 22, 2020, and claims priority to and the benefits of Korean Patent Application No. 10-2019-0010031, filed with the Korean Intellectual Property Office on Jan. 25, 2019, the entire contents of which are incorporated herein by reference.

TECHNICAL FIELD

The present application relates to a surface protective film; and a method for manufacturing an organic light emitting electronic device using the same.

BACKGROUND ART

A plastic substrate used as a substrate material for a flexible display has a problem in that gas barrier characteristics of moisture, oxygen, and the like are remarkably low. Thus, in the related art, the problem of the plastic substrate is alleviated by forming a barrier film to which various materials and structures are applied on the substrate.

However, recently, as existing barrier films are no longer used, there is a need for developing a surface protective film for a process capable of protecting a thin film encapsulation (TFE) layer during a process of manufacturing a flexible optical element. The surface protective film for a process is a film which protects a thin film encapsulation layer for a moment, and is attached to a thin film encapsulation layer during the process, and then removed.

PRIOR ART DOCUMENT

Patent Document (Patent Document 1) Korean Patent Application Laid-Open No. 10-2010-0003717

DISCLOSURE

Technical Problem

The present invention has been made in an effort to provide a surface protective film capable of being continuously attached to an organic light emitting element by a drum roll lamination method.

The surface protective film according to an exemplary embodiment of the present invention improves the service life of a drum pad used in a drum roll by preventing contamination of the drum pad.

Technical Solution

An exemplary embodiment of the present specification provides a surface protective film including: a base layer sequentially including a first anti-static layer, a base film, and a second anti-static layer; and an adhesive layer provided on a surface opposite to a surface of the second anti-static layer on which the base film is provided, in which the surface protective film satisfies the following Equation 1.

$$(\text{Adhesive Strength } A) - (\text{Adhesive Strength } B) > 0.5 gf/\text{in} \quad <\text{Equation 1}>$$

In the surface protective film, when a surface opposite to a surface of the adhesive layer on which the base layer is provided is defined as a first surface, and a surface opposite to a surface of the base layer on which the adhesive layer is provided is defined as a second surface, Adhesive Strength A is a peel strength when the first surface of the surface protective film is attached to glass using a 2 kg roller and the surface protective film is peeled off from the glass at 25° C., a peel speed of 2 m/min, and a peel angle of 180°, and Adhesive Strength B is a peel strength when the second surface of the surface protective film is attached to a drum pad using a 2 kg roller and the surface protective film is peeled off from the drum pad at 25° C., a peel speed of 2 m/min, and a peel angle of 180°.

An exemplary embodiment of the present specification also provides a method for manufacturing an organic light emitting electronic device, the method including: attaching the adhesive layer of the above-described surface protective film onto an encapsulation layer of an organic light emitting element.

Advantageous Effects

The surface protective film according to an exemplary embodiment of the present invention can be attached to an encapsulation layer of an organic light emitting element by a drum roll lamination method, so that the productivity of a product can be remarkably improved.

When the surface protective film according to an exemplary embodiment of the present invention is used, contamination of a drum pad to which the surface protective film is attached is low during the roll lamination process, so that the adhesive strength of the pad to the surface protective film can be maintained and the service life of the pad can be increased even though a process of attaching the surface protective film to the encapsulation layer is repeated.

DESCRIPTION OF DRAWINGS

FIGS. 1 to 3 illustrate a structure of a surface protective film according to an exemplary embodiment of the present invention.

FIG. 4 illustrates a form in which the surface protective film according to an exemplary embodiment of the present invention is attached to an organic light emitting element.

EXPLANATION OF REFERENCE NUMERALS AND SYMBOLS

100: Base layer
101: First anti-static layer
102: Base film
103: Second anti-static layer
200: Adhesive layer
300: Protective layer
301: Third anti-static layer
302: Protective film
303: Fourth anti-static layer
304: Release layer
500: Organic light emitting element
511: Back plate Film
512: Plastic substrate 513: Thin film transistor
514: Organic light emitting diode
515: Encapsulation Layer

BEST MODE

Hereinafter, preferred exemplary embodiments of the present application will be described. However, the exemplary embodiments of the present application can be modified differently from the following description, and the scope of the present application is not limited to the following description. The exemplary embodiments of the present application are provided to describe the present application to a person with ordinary skill in the art in detail.

In the present specification, 'p to q' means a range of 'p or more and q or less'.

In the present specification, the fact that a polymer includes a monomer means that the monomer participates in a polymerization reaction, and thus is included as a repeating unit in the polymer.

In the present specification, a copolymer includes a random copolymer having a form in which monomers are mixed irregularly, a block copolymer in which blocks arranged in predetermined intervals are repeated, or an alternating copolymer having a form in which monomers are polymerized alternately repeatedly.

When one layer is "provided" on one surface of another layer in the present specification, this includes not only a case where the one layer is brought into contact with one surface of the another layer, but also a case where still another layer is present between the two layers.

When one part "includes" one constituent element in the present specification, unless otherwise specifically described, this does not mean that another constituent element is excluded, but means that another constituent element can be further included. Furthermore, the fact that one part includes one constituent element means that one or more of the constituent elements are included.

In the present specification, unless otherwise limited, 'glass' may mean alkali-free glass (manufactured by NEG Co., Ltd., OA-21).

An exemplary embodiment of the present specification provides a surface protective film including: a base layer sequentially including a first anti-static layer, a base film, and a second anti-static layer; and an adhesive layer provided on a surface opposite to a surface of the second anti-static layer on which the base film is provided, in which the surface protective film satisfies Equation 1. When the surface protective film satisfies the relationship of Equation 1, the surface protective film attached to a drum pad can be easily laminated to glass.

FIG. 1 illustrates a surface protective film according to an exemplary embodiment of the present invention. Referring to FIG. 1, the surface protective film according to an exemplary embodiment of the present invention includes: a base layer 100 in which a first anti-static layer 101, a base film 102, and a second anti-static layer 103 are sequentially provided; and an adhesive layer 200.

In an exemplary embodiment, the surface protective film of the present invention can be attached to the surface of an organic light emitting element by a drum roll lamination method, and in this case, the surface protective film can be supplied to the surface of an adherend by a rotation roll to which a drum pad is attached.

In the present specification, Equation 1 can be satisfied for any one drum pad, and when the surface protective film according to an exemplary embodiment of the present specification is used together with a drum pad satisfying Equation 1, the surface protective film is easily transferred by the drum roll lamination method.

In an exemplary embodiment, the drum pad can be IMP 1P4-40SBL-S manufactured by DCTK. Since surface characteristics of an organic light emitting element to which the surface protective film is attached are similar to those of a glass plate, the surface protective film attached to the drum pad can be easily laminated to the surface of the organic light emitting element when the surface protective film satisfies the relationship of Equation 1.

In an exemplary embodiment, Adhesive Strength A of Equation 1 is an adhesive strength between the adhesive layer and an adherend, and Adhesive Strength B can mean an adhesive strength between the base layer and the drum pad. When (Adhesive Strength A)−(Adhesive Strength B) is 0.5 gf/in or less, it is difficult for the surface protective film to be transferred from the drum pad to the adherend.

In an exemplary embodiment, the (Adhesive Strength A)−(Adhesive Strength B) is more than 0.8 gf/in, and in this case, the surface protective film is more easily transferred from the drum pad to the adherend by the drum roll lamination method.

As long as the surface protective film satisfies the lower limit value of (Adhesive Strength A)−(Adhesive Strength B), the effects intended by the present invention are realized. The upper limit of (Adhesive Strength A)−(Adhesive Strength B) is not limited, but can be 10 gf/in or less in an exemplary embodiment.

In the present specification, the second surface means a surface of a base layer, which is parallel with a surface facing the adhesive layer among various surfaces of the base layer, and faces the opposite direction.

In an exemplary embodiment, the second surface means a surface opposite to a surface of the first anti-static layer on which the base film is provided.

In an exemplary embodiment, Adhesive Strength A and Adhesive Strength B can have any adhesive strength as long as Adhesive Strength A and Adhesive Strength B satisfy the relationship of Equation 1. Adhesive Strengths A and B are not limited, but in an exemplary embodiment, Adhesive Strength A is 3 gf/in to 10 gf/in, and Adhesive Strength B is 2 gf/in to 9.5 gf/in.

In the present specification, a contact angle is a contact angle of a liquid on a solid surface when the liquid is thermodynamically equilibrated on the solid surface. The contact angle is a measure of the wettability of the solid surface. A low contact angle indicates high wettability (hydrophilicity) and high surface energy, and a high contact angle indicates low wettability (hydrophobicity) and low surface energy.

In an exemplary embodiment, a water contact angle of the second surface is 80° or more. The higher the water contact angle of the second surface of the surface protective film is, the less the impurities such as dust are attached to the second surface, so that during the process of attaching and detaching the second surface to and from the drum pad, the degree of contamination of the drum pad becomes low, thereby increasing the service life of the drum pad.

In an exemplary embodiment, a water contact angle of the second surface is 88° or more. When the water contact angle of the second surface is 88° or more, the service life of the drum pad can be further increased. In the present specification, the material for the base layer can be changed as long as the water contact angle of the second surface satisfies the above range.

In an exemplary embodiment, the water contact angle of the second surface is 180° or less.

The water contact angle is a contact angle at the time point when 10 seconds have passed after dropping 4 ml of ultrapure water (DI water) onto a sample to be measured. The water contact angle is measured using a contact angle analyzer.

In an exemplary embodiment, an adhesive strength maintenance ratio of the second surface is 90% or more.

In an exemplary embodiment, an adhesive strength maintenance ratio of the second surface is 97% or more.

The adhesive strength maintenance ratio (%) is (Adhesive Strength C)/(Adhesive Strength B)×100, Adhesive Strength B is a peel strength when the second surface of the surface protective film is peeled off from a drum pad at a peel speed of 2 m/min and a peel angle of 180°, and Adhesive Strength C is a peel strength when fifty surface protective films and one drum pad are prepared, a second surface of each of the fifty surface protective films is attached to the same site of the one drum pad, and the fiftieth surface protective film is peeled off from the drum pad when the process of peeling off the surface protective film at a peel speed of 2 m/min and a peel angle of 180° is sequentially repeated 50 times.

When the method for measuring Adhesive Strength C is described in more detail, the method repeats a process of attaching and peeling off the fifty surface protective films to and from one drum pad, and this means that the positions of the drum pad to which the fifty surface protective films are attached are the same, and the attachment and peeling processes are repeated 50 times by performing a method of attaching one surface protective film and peeling off the one surface protective film, and then attaching another surface protective film and peeling off the another surface protective film.

In an exemplary embodiment, an adhesive strength maintenance ratio of the second surface is 100% or less.

In an exemplary embodiment, the fact that the adhesive strength maintenance ratio of the second surface is 100% means that even though the process of attaching the fifty surface protective films to the same drum pad and removing the fifty surface protective films is sequentially repeated 50 times, the adhesive strength of the drum pad to the second surface of the surface protective film is the same as the initial adhesive strength.

In an exemplary embodiment, the surface protective film includes: a base layer sequentially including a first anti-static layer, a base film, and a second anti-static layer; and an adhesive layer provided on the second anti-static layer, and satisfies Equation 1.

In an exemplary embodiment, the adhesive layer is directly provided on the second anti-static layer. In the present specification, the 'X layer is directly provided on Y layer' means that X layer is brought into contact with Y layer.

In an exemplary embodiment, the surface protective film further includes a protective layer sequentially including a third anti-static layer, a protective film, and a fourth anti-static layer, and the adhesive layer is provided between the protective layer and the base layer.

Referring to FIG. 2, the surface protective film according to an exemplary embodiment of the present invention sequentially includes a first anti-static layer 101, a base film 102, a second anti-static layer 103, an adhesive layer 200, a third anti-static layer 301, a protective film 302, and a fourth anti-static layer 303.

In an exemplary embodiment, the third anti-static layer is brought into contact with the adhesive layer.

As the adhesive layer, any appropriate adhesive layer can be adopted as long as the adhesive layer can realize an adhesive strength satisfying the relationship of Equation 1.

The adhesive layer can include at least one adhesive selected from an acrylic adhesive; a urethane-based adhesive; a polyester-based adhesive; a vinylalkyl ether-based adhesive; a polyamide-based adhesive; a styrene-diene block copolymer-based adhesive; a rubber-based adhesive; and a silicone-based adhesive, but is not limited thereto.

The adhesive layer can further include any other components within the range not impairing the effects of the present invention. Examples of the other components include a tackifier, an inorganic filler, an organic filler, a metal powder, a pigment, a foil-shaped material, a softener, a plasticizer, an age resistor, a conductive agent, an anti-static agent, an antioxidant, a UV absorbent, a light stabilizer, a surface lubricant, a leveling agent, a corrosion inhibitor, a heat-resistant stabilizer, a polymerization inhibitor, a lubricant, a solvent, and the like.

In an exemplary embodiment, the acrylic adhesive can be an acrylic polymer including one type or two or more types of alkyl(meth)acrylates as a monomer component. The acrylic polymer can be a homopolymer or a copolymer.

In the alkyl(meth)acrylate, an alkyl group can be a straight-chained or branched alkyl group having 1 to 20 carbon atoms. The alkyl(meth)acrylate can be, for example, methyl(meth)acrylate, ethyl(meth)acrylate, n-propyl(meth)acrylate, isopropyl(meth)acrylate, n-butyl(meth)acrylate, t-butyl(meth)acrylate, sec-butyl(meth)acrylate , pentyl (meth)acrylate, 2-ethylhexyl(meth)acrylate, 2-ethylbutyl (meth)acrylate, n-octyl(meth)acrylate, isooctyl(meth)acrylate, isononyl(meth)acrylate, lauryl(meth)acrylate, tetradecyl(meth)acrylate, and the like, but is not limited thereto. The (meth)acrylate means acrylate and/or methacrylate. The alkyl(meth)acrylate can be included in an amount of 50 wt % to 100 wt % based on 100 wt % of a total monomer component constituting an acrylic adhesive.

The acrylic polymer can include other polymer units polymerizable with the alkyl(meth)acrylate. As the other monomer units, for example, it is possible to use one type or two or more types selected from a carboxyl group-containing monomer such as acrylic acid, methacrylic acid, carboxyethyl acrylate, carboxypentyl acrylate, itaconic acid, maleic acid, fumaric acid, and crotonic acid; an acid anhydride monomer such as anhydrous maleic acid and anhydrous itaconic acid; a hydroxyl group-containing monomer such as hydroxyethyl(meth)acrylate, hydroxypropyl(meth)acrylate, hydroxybutyl(meth)acrylate, hydroxyhexyl(meth)acrylate, hydroxyoctyl(meth)acrylate, hydroxydecyl(meth)acrylate, hydroxylauryl(meth)acrylate, and (4-hydroxymethyl cyclohexyl)methyl(meth)acrylate; a sulfonic acid group-containing monomer such as styrene sulfonic acid, allyl sulfonic acid, 2-(meth)acrylamide-2-methylpropanesulfonic acid, (meth)acrylamidepropanesulfonic acid, sulfopropyl(meth)acrylate, and (meth)acryloyloxynaphthalene sulfonic acid; an amide-based monomer such as (meth)acrylamide, N,N-dimethyl(meth)acrylamide, N-butyl(meth)acrylamide, N-methylol(meth)acrylamide , and N-methylolpropane(meth)acrylamide; an amino group-containing monomer such as dimethylaminoethyl(meth)acrylate, N,N-dimethylaminoethyl (meth)acrylate, and t-butylaminoethyl(meth)acrylate; an alkoxyalkyl group-containing monomer such as methoxyethyl(meth)acrylamide and ethoxyethyl(meth)acrylamide; an imide group-containing monomer such as N-cyclohexylmaleimide, N-isopropylmaleimide, N-laurylmaleimide, N-phenylmaleimide, N-methylitaconimide, N-ethylitaconimide, N-butylitaconimide, N-octylitaconimide, N-2-ethylhexylitaconimide, N-cyclohexylitaconimide, and N-laurylitaconimide; a succinimide-based monomer such as N-(meth)acryloyloxymethylene succinimide, N-(meth)acryloyl-6-oxyhexamethylene succinimide, and N-(meth)acryloyl-8-oxyoctamethylene succinimide; a vinyl-based monomer such as vinyl acetate, vinyl propionate, N-vinylpyrrolidone, methylvinylpyrrolidone, vinylpyridine, vinylpiperidone, vinylpyrimidine, vinylpiperazine, vinylpyrazine, vinylpyrrole, vinylimidazole, vinyloxazole, vinylmorpholine, N-vinylcarboxylic acid amides, styrene, α-methylstyrene, chlorostyrene, chloromethylstyrene, and N-vinylcaprolactam; a cyano group-containing monomer such as acrylonitrile and methacrylonitrile; an epoxy group-containing acrylic resin-based monomer such as (meth)acrylic acid glycidyl; a glycol-based(meth)acrylate monomer such as polyethylene glycol (meth)acrylate, polypropylene glycol(meth)acrylate, methoxyethylene glycol(meth)acrylate, and methoxypolypropylene glycol(meth)acrylate; an ester-based(meth)acrylate monomer having a polycycle such as tetrahydrofurfuryl, fluorine(meth)acrylate, and silicone(meth)acrylate, a halogen atom, a silicon atom, and the like; a polyfunctional monomer such as hexanediol di(meth)acrylate, (poly)ethylene glycol di(meth)acrylate, (poly) propylene glycol di(meth)acrylate, neopentyl glycol di(meth)acrylate, pentaerythritol di(meth)acrylate, trimethylolpropane tri(meth)acrylate, pentaerythritol tri(meth)acrylate, dipentaerythritol hexa(meth)acrylate, epoxy acrylate, polyester acrylate, and urethane acrylate; an olefin-based monomer such as isoprene, butadiene, and isobutylene; and a vinyl ether-based monomer such as vinyl ether, but the other monomer units are not limited thereto. The other monomer units polymerizable with the alkyl(meth)acrylate can be included in an amount of 0 wt % to 50 wt % based on 100 wt % of a total monomer component constituting an acrylic adhesive.

The urethane-based adhesive layer can be an adhesive layer including a polyurethane-based resin. In an exemplary embodiment, the polyurethane resin means a resin obtained by curing a composition containing a polyol and a polyfunctional isocyanate compound. The urethane-based resin can be included in an amount of 50 wt % to 100 wt % based on 100 wt % of a urethane-based adhesive layer.

The polyol can be one type or two or more types, and any appropriate polyol having two or more hydroxyl groups can be selected. In an exemplary embodiment, the polyol can be a polyester-based polyol, a polyether-based polyol, a polycarbonate-based polyol, a polycaprolactone-based polyol, and the like, but is not limited thereto.

The polyester-based polyol is a polyol including an ester bond formed by a reaction of a polyol and carboxyl acid, and includes a polyetherester polyol, a polycarbonate polyester polyol, and the like. The polyol can be ethylene glycol, 1,3-propylene glycol, diethylene glycol, 1,4-butylene glycol, pentaerythritol, triethanolamine, hexanetriol, polypropylene glycol, 1,2-hexanediol, and the like, but is not limited thereto. The carboxylic acid can be succinic acid, maleic acid, adipic acid, pimelic acid, azelaic acid, sebacic acid, 1,9-nonamethylenedicarboxylic acid, 1,12-dodecamethylenedicarboxylic acid, phthalic acid, isophthalic acid, terephthalic acid, 1,4-naphthalenedicarboxylic acid, 4,4'-biphenyldicarboxylic acid or an anhydride thereof, and the like, but is not limited thereto.

The polyether-based polyol is a polyol formed by using polyol, bisphenols, dihydroxybenzene, and the like as an initiator, and subjecting an alkylene oxide such as ethylene oxide, propylene oxide, and butylene oxide to addition polymerization. For example, the polyether-based polyol can be polyethylene glycol, polypropylene glycol, polytetramethylene glycol, and the like, but is not limited thereto.

The polycaprolactone-based polyol is a polyol formed by subjecting lactones such as ε-caprolactone, δ-valerolactone, and β-methyl-δ-valerolactone to a ring-opening polymerization For example, the polycaprolactone polyol can be dimethyl carbonate, diethyl carbonate, ethylene carbonate, and the like, but is not limited thereto.

The polycarbonate-based polyol is a polyol formed by ring-opening polymerizing lactones with a polycaronate polyol, or copolymerizing a polycarbonate-based polyol with a polyester-based polyol or a polyether-based polyol, and the like.

The polyfunctional isocyanate compound can be one type or two or more type, and any polyfunctional isocyanate can be selected as long as the polyfunctional isocyanate compound can cause a urethanization reaction with a polyol. As the polyfunctional isocyanate compound, in an exemplary embodiment, an isocyanate compound (a2) can use one type or two or more types selected from the group consisting of 2,4- or 4,4'-methylene diphenyl diisocyanate (MDI), xylylene diisocyanate (XDI), m- or p-tetramethylxylylene diisocyanate (TMXDI), toluylene diisocyanate (TDI), di- or tetra-alkyldiphenylmethane diisocyanate, 3,3'-dimethyldiphenyl-4,4'-diisocyanate (TODI), 1,3-phenylene diisocyanate, 1,4-phenylene diisocyanate, naphthalene diisocyanate (NDI), 4,4'-dibenzyldiisocyanate, hydrogenated MDI (H12MDI), 1-methyl-2,4-diisocyanatocyclohexane, 1,12-diisocyanatododecane, 1,6-diisocyanato-2,2,4-trimethylhexane, 1,6-diisocyanato-2,4,4-trimethylhexane, isophorone diisocyanate (IPDI), tetramethoxybutane-1,4-diisocyanate, butane-1,4-diisocyanate, hexane-1,6-diisocyanate (HDI), dimer fatty acid diisocyanate, dicyclohexylmethane diisocyanate, cyclohexane-1,4-diisocyanate, and ethylene diisocyanate, but is not limited thereto.

In an exemplary embodiment, an equivalent ratio of an isocyanate group between the polyol and the polyfunctional isocyanate compound and a hydroxyl group; and a content ratio of the polyol and the polyfunctional isocyanate compound can be arbitrarily appropriately selected in consideration of characteristics of an adhesive layer.

As the rubber-based adhesive, natural rubber or various synthetic rubbers can be used. The synthetic rubber can be a rubber-based adhesive employing, as a base polymer, for example, polyisoprene rubber, styrene-butadiene (SB) rubber, styrene-isoprene (SI) rubber, styrene-isoprene-styrene block copolymer (SIS) rubber, styrene·butadiene-styrene block copolymer (SBS) rubber, styrene-ethylene-butylene-styrene block copolymer (SEBS) rubber, styrene-ethylene-propylene-styrene block copolymer (SEPS) rubber, styrene-ethylene-propylene block copolymer (SEP) rubber, reclaimed rubber, butyl rubber, polyisobutylene, modifications thereof, and the like, but the synthetic rubber is not limited thereto.

The silicone-based adhesive can adopt any appropriate silicone-based adhesive. As such a silicone-based adhesive, preferably, those obtained by blending or aggregating a silicon resin can be adopted. As the silicone-based adhesive, an addition reaction-curable silicone-based adhesive or a peroxide-curable silicone-based adhesive can be used.

The addition reaction-curable silicone-based adhesive can be formed by reacting a hydrosilyl group-containing siloxane compound with an alkenyl group-containing organopolysiloxane.

Specific examples of the alkenyl group-containing organopolysiloxane include dimethylpolysiloxane blocked with a dimethylvinylsiloxy group at both ends of the molecular chain, a dimethylsiloxane-methylvinylsiloxane copolymer blocked with dimethylvinylsiloxane groups at both ends of the molecular chain, a dimethylsiloxane-methylphenylsiloxane copolymer blocked with dimethylvinylsiloxy groups at both ends of the molecular chain, methylvinylpolysiloxane blocked with trimethylsiloxy groups at ends both of the molecular chain, a dimethylsiloxane-methylvinylsiloxane copolymer blocked with trimehylsiloxy groups at both ends of the molecular chain, a dimethylsiloxane-methyl (5-hexenyl) siloxane copolymer blocked with trimethylsiloxy groups at both ends of the molecular chain, a dimethylsiloxane-methylvinyl siloxane-methylphenylsiloxane copolymer blocked with dimethylvinylsiloxy groups at both ends of the molecular chain, methylvinylpolysiloxane blocked with dimethylhydroxyl groups at both ends of the molecular chain or a dimethylsiloxane-methylvinylsiloxane copolymer blocked with dimethylhydroxyl groups at both ends of the molecular chain, and the like, but are not limited thereto.

The peroxide-curable silicone-based adhesive can be formed by curing a composition including a peroxide-curable silicone resin and a peroxide curing agent. The peroxide-curable silicone resin can include a peroxide-curable silicone rubber and/or a partial condensate thereof.

The peroxide-curable silicone rubber is not particularly limited, and any organopolysiloxane having dimethylsiloxane as a main constituent unit can be used without limitation. Functional groups other than a hydroxyl group can be introduced into the organopolysiloxane, if necessary. Specific examples of the organopolysiloxane include dimethylpolysiloxane. The peroxide-curable silicone resin can include two or more types of peroxide-curable silicone rubbers, and can include two or more types of partial condensates of the peroxide-curable silicone rubber.

The peroxide curing agent can be, for example, benzoyl peroxide, t-butylperoxybenzoate, dicumyl peroxide, t-butylcumyl peroxide, di-t-butylperoxide, 2,5-dimethyl-2,5-di(t-butylperoxy) hexane, 2,4-dichlorobenzoyl peroxide, 1,1-bis (t-butylperoxy)-3,3,5-trimethylcyclohexane, or 2,5-dimethyl-2,5-di(t-butylperoxy) hexyne-3, but is not limited thereto.

In the present invention, the thickness of the adhesive layer can be appropriately selected in consideration of the purpose of the present application. For example, the adhesive layer can have a thickness of 10 μm or more; 30 μm or more; or 45 μm or more. For example, the adhesive layer can have a thickness of 200 μm or less; 150 μm or less; 100 μm or less; or 90 μm or less. By setting the thickness of the adhesive layer in the above range, the adhesiveness and wettability of the adhesive layer to the surface of the adherend can be improved.

A polymer which can be included in the adhesive layer can be prepared by a typical polymerization method, for example, a method such as solution polymerization, photopolymerization, bulk polymerization, suspension polymerization, or emulsion polymerization.

A method for forming the adhesive layer is not particularly limited, and for example, it is possible to use a method for forming the adhesive layer by applying an adhesive composition to a base film by a typical means such as a bar coater, or a method for forming an adhesive layer by applying an adhesive composition to a surface of a peelable base in advance, and then transferring the adhesive layer to the base film again, and the like. In an exemplary embodiment, the adhesive layer can be formed by further performing a drying and/or curing process.

As a method for applying the adhesive composition, it is possible to adopt a roll coating method such as reverse coating and gravure coating, a spin coating method, a screen coating method, a fountain coating method, a dipping method, a spray method, and the like, but the method is not limited thereto.

As a method for drying the adhesive composition, any publicly known drying method can be used, and in an exemplary embodiment, a method such as an oven and a hot plate can be used.

A method for curing the adhesive layer is not particularly limited, and for example, a curing method can be adopted through an appropriate heating, drying, and/or aging process and a process by electromagnetic wave.

In the present specification, the term 'anti-static layer' means a layer intended to suppress the generation of static electricity.

The first to fourth anti-static layers can be formed by a publicly known method in order to achieve a desired effect. For example, the first to fourth anti-static layers can be formed on both surfaces of the base film and both surfaces of the protective film by an in-line coating method. In the in-line coating method, since the coating is performed during the film preparation process, the adhesion between the coating layer and the film is increased and the coating layer is continuously imparted with the preparation of the film, so that there is an advantage in that the process can be shortened and the film can be prepared as thin as possible.

In the present invention, the first to fourth anti-static layers can be formed of an appropriate anti-static composition in consideration of the purpose of the present application. For example, the first to fourth anti-static layers can include one or a mixture thereof selected from the group consisting of an acrylic resin, a urethane-based resin, a urethane-acrylic copolymer, an ester-based resin, an ether-based resin, an amide-based resin, an epoxy-based resin, and a melamine resin, but are not limited thereto.

In one example, the first to fourth anti-static layers can include a conductive material. The conductive material can include a conductive polymer or carbon nanotube, but is not limited thereto.

The conductive polymer can consist of, for example, a polyaniline-, polypyrrole-, polythiophene-based polymer, a derivative thereof, and a copolymer thereof, but is not limited thereto.

The carbon nanotube can have a tubular form produced by rolling a graphite plate formed by connecting hexagonal rings each consisting of 6 carbon atoms. The carbon nanotube is excellent in rigidity and electrical conductivity, so that when the carbon nanotube is used as an anti-static layer of a surface protective film, the hardness of the anti-static layer can be increased, and the anti-static function can be improved. The carbon nanotube can be a multi-walled carbon nanotube or a single-walled carbon nanotube.

The types of base film and protective film are not particularly limited. The base film can include one or more selected from the group consisting of, for example, polyethylene terephthalate; polytetrafluoroethylene; polyethylene; polypropylene; polybutene; polybutadiene; a vinyl chloride copolymer; polyurethane; ethylene-vinyl acetate; an ethylene-propylene copolymer; an ethylene-acrylic acid ethyl copolymer; an ethylene-acrylic acid methyl copolymer; polyimide; nylon; a styrene-based resin or elastomer; a polyolefin-based resin or elastomer; other elastomers; a polyoxyalkylene-based resin or elastomer; a polyester-based resin or elastomer; a polyvinyl chloride-based resin or elastomer; a polycarbonate-based resin or elastomer; a polyphenylenesulfide-based resin or elastomer; a hydrocarbon mixture; a polyamide-based resin or elastomer; an acrylate-based resin or elastomer; an epoxy-based resin or elastomer; a silicone-based resin or elastomer; and a liquid crystal polymer, but is not limited thereto. In an exemplary embodiment, the base film and the protective film can be a polyethylene terephthalate (PET) film. The base film and the protective film can be composed of a single layer, or can be stacked with two or more layers.

One surface or both surfaces of the base film and the protective film can be subjected to a typical physical or chemical surface treatment such as a mat treatment, a corona discharge treatment, a primer treatment, and a cross-linking treatment in order to enhance adhesion, sustainability, and the like with an adhesive layer or other layers.

The thicknesses of the base film and the protective film can be appropriately selected in consideration of the purpose of the present application.

In an exemplary embodiment, the base film can have a thickness of 25 μm or more and 150 μm or less, 50 μm or more and 125 μm or less, or 75 μm or more and 100 μm or less. When the range of the base film is in less than the above thickness range at the time of laminating a base layer on which an adhesive layer is formed to the encapsulation layer of the organic light emitting element, there is a concern in that the base film is easily deformed, and when the range of the base film is in more than the above thickness range, lamination defect may occur.

In an exemplary embodiment, the protective film can have a thickness of 25 μm or more and 150 μm or less, 25 μm or more and 125 μm or less, or 25 μm or more and 100 μm or less.

In an exemplary embodiment, the protective layer further includes a release layer provided on a surface opposite to a surface of the third anti-static layer on which the protective film is provided.

Referring to FIG. 3, the surface protective film according to an exemplary embodiment of the present invention includes: a base layer in which a first anti-static layer 101, a base film 102, and a second anti-static layer 103 are sequentially provided; an adhesive layer 200; and a protective layer 300 in which a release layer 304, a third anti-static layer 301, a protective film 302, and a fourth anti-static layer 303 are sequentially provided. The release layer can be provided between the third anti-static layer 301 and the adhesive layer 200.

The release layer can be appropriately selected in consideration of the purpose of the present invention. In an exemplary embodiment, the release layer can be formed of an appropriate release agent as long as the adhesive layer is within a range satisfying the relationship of Equation 1. As the material for the release layer, it is possible to use, for example, a silicone-based release agent, a fluorine-based release agent, a long-chain alkyl-based release agent, a fatty acid amide-based release agent, and the like, but the material is not limited thereto. In an exemplary embodiment, as the material for the release layer, a silicone-based release agent can be used.

The release layer can be formed by coating, for example, a third anti-static layer with the release agent and drying the release agent. As the coating method, specifically, it is possible to use, for example, roll coating, gravure coating, micro gravure coating, kiss gravure coating, comma knife coating, roll coating, spray coating, Meyer Bar coating, slot die coating, Reverser coating, a flexo method, an offset method, and the like. The thickness of the release layer can be appropriately selected in consideration of the purpose of the present application. For example, the thickness of the release layer can be 10 nm or more and 500 nm or less; 10 nm or more and 300 nm or less; or 10 nm or more and 200 nm or less. When the release layer is less than or more than the thickness of the above-described range, film defects may occur during the process.

The present invention also provides a method for manufacturing an organic light emitting electronic device, the method including: attaching an adhesive layer of a surface protective film onto an encapsulation layer of an organic light emitting element.

In the present specification, the drum roll lamination method means a method of laminating a surface protective film to a surface of an adherend by continuously supplying the surface protective film to a rotatable drum roll. When the drum roll lamination method is used, the production amount of the product per hour is increased, and manpower and cost invested during the process are reduced, thereby improving the workability.

In an exemplary embodiment, a drum roll (laminate drum) to which a drum pad is attached is installed on a line through which an adherend is transported, and while a surface protective film attached to the drum pad is transferred to the adherend, the surface protective film and the adherend are laminated to each other.

In an exemplary embodiment, the adherend can be an organic light emitting element.

In an exemplary embodiment, the organic light emitting element sequentially includes a back plate, a plastic substrate, an organic light emitting diode, a thin film transistor, and an encapsulation layer. In the drum roll lamination process, an adhesive layer of the surface protective film can be attached to the encapsulation layer.

The encapsulation layer can exhibit excellent moisture blocking characteristics and optical characteristics in the organic light emitting electronic device. Further, the encapsulation layer can be formed as a stable encapsulation layer regardless of the form of an organic light emitting electronic device such as top emission or bottom emission.

In an exemplary embodiment, the encapsulation layer can include a single layer or multi-layers of an inorganic material layer. As a method for forming the encapsulation layer, a typical method for forming an encapsulation layer known in the art can be applied.

The single layer or multi-layers of an inorganic material layer can include, for example, an aluminum oxide-based inorganic material layer, a silicon nitride-based inorganic material layer, a silicon oxynitride-based inorganic material layer, and the like.

In an exemplary embodiment, the drum pad includes one or two or more selected from the group consisting of silicone rubber, fluorine rubber, acrylic rubber, polyurethane rubber, polyamide rubber, natural rubber, polyisobutylene rubber, polyisoprene rubber (IR), isobutylene-isoprene rubber (IIR), chloroprene rubber (CR), butyl rubber, nitrile butyl rubber, nitrile butadiene rubber (NBR), styrene-butadiene rubber (SBR), styrene-butadiene-styrene (SBS) rubber, styrene-isoprene-styrene (SIS) rubber, styrene-ethylene-butadiene rubber, styrene-ethylene-butadiene-styrene (SBBS) rubber, styrene-isoprene-propylene-styrene rubber, chlorosulfonated polyethylene rubber, and ethylene-propylene-diene rubber (EPDM).

In an exemplary embodiment, the drum pad can be a urethane-based pad, an acrylic pad, or a rubber-based pad.

In an exemplary embodiment, the drum pad includes pores having a diameter of 200 μm or less. Diameters of pores included in the drum pad can be the same as or different from one another, and the pores are irregularly distributed in the drum pad.

In an exemplary embodiment, the urethane-based pad can be prepared by reacting an alcohol derivative; a lactic acid compound or a caprolactone compound; and an isocyanate compound.

In an exemplary embodiment, the acrylic pad can be prepared by reacting a monomer including: methylacrylate; ethylacrylate; a hydroxyl group or a cross-linkable group.

In an exemplary embodiment, when the urethane-based pad and the acrylic pad are manufactured, pores can be formed by adding a foaming agent or injecting bubbles, but the pore formation method is not limited.

In an exemplary embodiment, when the surface protective film further includes a protective layer, the method for manufacturing an organic light emitting electronic device further includes: removing a protective layer from the surface protective film.

In an exemplary embodiment, the method for attaching a surface protective film onto an encapsulation layer of an organic light emitting element can be performed by a drum roll lamination method.

In an exemplary embodiment, the form in which the above-described surface protective film is attached to the optical film can be a form in which a back plate 511; a plastic substrate 512; a thin film transistor 513; an organic light emitting diode 514; an encapsulation layer 515; an adhesive layer 200; and a base layer 100 are sequentially stacked, as illustrated in FIG. 4.

The method for manufacturing an organic light emitting electronic device further includes; removing the base film after the attaching of the surface protective film onto the encapsulation layer.

In an exemplary embodiment, the method for manufacturing an organic light emitting electronic device further includes: removing the surface protective film from the encapsulation layer; and stacking a touch screen panel and a cover window onto the encapsulation layer.

MODE FOR INVENTION

Hereinafter, the present application will be described in more detail through the Examples which follows the present application and the Comparative Examples which do not follow the present application, but the scope of the present application is not limited by the Examples suggested below.

Example 1

72 parts by weight of methyl methacrylate (MMA), 23 parts by weight of n-butyl methacrylate (NBMA), 5 parts by weight of acrylic acid (AA), and a polymerization initiator azobisisobutyronitrile (AIBN) were introduced into a methyl ethyl ketone (MEK) solvent heated to the boiling point, and mixed and added dropwise at 80° C. to 85° C., thereby preparing an acrylic binder having a conversion rate of 95% or more.

10 g of a solution (A) diluted by mixing 100 parts by weight of methyl ethyl ketone (MEK) and 5 parts by weight of the acrylic binder, 90 g of a solution (B) diluted by mixing 100 parts by weight of propanol and 0.1 part by weight of a multi-walled carbon nanotube (MWCNT, Wonil Corporation), and 5 g of a solution (C) diluted by mixing 100 parts by weight of methyl ethyl ketone (MEK) and 5 parts by weight of an epoxy curing agent (BXX-5420, SAMYOUNG INK&PAINT INDUSTRIAL, CO., LTD.) were mixed, thereby preparing an anti-static layer composition.

After both surfaces of a polyethylene terephthalate (PET) film were each coated to a thickness of 100 nm with the prepared anti-static layer composition, the polyethylene terephthalate (PET) film was dried at 100° C. for 3 minutes, thereby preparing a base layer.

Subsequently, a urethane-based adhesive layer was formed on the outer surface of the second anti-static layer, which is positioned on the opposite side of the base film in the base layer, by coating a solution prepared by adding 5 parts by weight of an isocyanate curing agent to 100 parts by weight of a urethane-based adhesive resin resin (UA-4, SAMHWA PAINTS INDUSTRIAL CO., LTD.) and then the coated urethane-based adhesive resin was dried and aged, thereby preparing a urethane-based adhesive layer.

A protective layer (12ASW, SKC Co., Ltd.) was prepared, in which a third anti-static layer and a fourth anti-static layer were formed on both surfaces of a polyethylene terephthalate (PET) film (XD510P, TAK Inc.) having a thickness of 50 μm and the third anti-static layer was coated with a release layer. The base layer, provided with the adhesive layer, was laminated to the protective layer, such that a surface on which the release layer was formed was brought into contact with the adhesive layer, thereby preparing a surface protective film having a thickness of 150 μm.

Example 2

A surface protective film was prepared in the same manner as in Example 1, except that a single-walled carbon nanotube (SWCNT, Wonil Corporation) was used instead of the multi-walled carbon nanotube (MWCNT, Wonil Corporation), and the epoxy curing agent was used in an amount of 7 parts by weight instead of 5 parts by weight.

Example 3

A surface protective film was prepared in the same manner as in Example 1, except that n-hexyl methacrylate was used instead of n-butyl methacrylate (NBMA), and the epoxy curing agent was used in an amount of 7 parts by weight instead of 5 parts by weight.

Example 4

A surface protective film was prepared in the same manner as in Example 1, except that a single-walled carbon nanotube (SWCNT, Wonil Corporation) was used instead of the multi-walled carbon nanotube (MWCNT, Wonil Corporation), n-hexyl methacrylate was used instead of n-butyl methacrylate (NBMA), and the epoxy curing agent was used in an amount of 7 parts by weight instead of 5 parts by weight.

Comparative Example 1

A surface protective film was prepared in the same manner as in Example 1, except that 60 parts by weight of methyl methacrylate and 40 parts by weight of methylether methacrylate (Mn=500 g/mol) were used instead of 72 parts by weight of methyl methacrylate (MMA), 23 parts by weight of n-butyl methacrylate (NBMA), and 5 parts by weight of acrylic acid (AA).

Comparative Example 2

A surface protective film was prepared in the same manner as in Example 1, except that 50 parts by weight of butyl methacrylate and 50 parts by weight of methylether methacrylate (Mn=500 g/mol) were used instead of 72 parts by weight of methyl methacrylate (MMA), 23 parts by weight of n-butyl methacrylate (NBMA), and 5 parts by weight of acrylic acid (AA).

Measurement Method of Adhesive Strength A

A sample was prepared by cutting the prepared surface protective film so as to have a width of 25 mm and a length of 150 mm. A first surface of the surface protective film was attached to glass by removing the protective layer from the surface protective film and using a 2 kg roller. Subsequently, a peel strength was evaluated when the surface protective film was peeled off from the glass at 25° C., a peel speed of 2 m/min, and a peel angle of 180° using an apparatus (Texture Analyzer, manufactured by Stable Micro Systems, UK), and the peel strength was defined as Adhesive Strength A.

Measurement Method of Adhesive Strength B

A sample was prepared by cutting the prepared surface protective film so as to have a width of 25 mm and a length of 150 mm. A second surface of the surfaced protective film was attached to a drum pad (DCTK, IMP 1P4-40SBL-S) by removing the protective layer from the surface protective film and using a 2 kg roller. Subsequently, a peel strength was evaluated when the surface protective film was peeled off from the drum pad at 25° C., a peel speed of 2 m/min, and a peel angle of 180° using an apparatus (Texture Analyzer, manufactured by Stable Micro Systems, UK), and the peel strength was defined as Adhesive Strength B.

Measurement of Water Contact Angle

A water contact angle was measured at the time point when 10 seconds have passed after dropping 4 ml of ultrapure water (DI water) onto the prepared surface protective film using a contact angle measurement apparatus (drop shape analyzer, KRUSS GmbH).

Determination of Lamination

A sample was prepared by cutting the prepared surface protective film so as to have a width of 100 mm and a length of 250 mm. A second surface of the surfaced protective film was attached to a drum pad (DCTK, IMP 1P4-40SBL-S) by removing the protective layer from the surface protective film and using a 2 kg roller. Thereafter, the adhesive layer of the surface protective film was attached to glass, and the attached pad was peeled off from the glass at a peel speed of 2 m/min and a peel angle of 180°. The test was performed 10 times using 10 surface protective films, 10 drum pads, and 10 sheets of glass. In all of the tests performed 10 times, the case where the surface protective film was peeled off from the drum pad and attached to glass, and the surface protective film was attached to the glass without lifting when confirmed by the unaided eye was denoted as 'O'. In the tests performed 10 times, the case where the surface protective film was not removed from the attached pad even once, or there was a lifting between the surface protective film and the glass was denoted as 'X'.

Measurement of Number of Drum Pad Laminations

In the same manner as in the measurement method of Adhesive Strength B, while the process of attaching the surface protective film to one drum pad (DCTK, IMP 1P4-40SBL-S) and peeling off the surface protective film from the drum pad was repeated, the number of times that the surface protective film could be attached to the drum pad was measured. Here, the surface protective films used for attachment were different surface protective films prepared by the aforementioned method. When the surface protective film was attached to the drum pad, the case where lifting occurred while the ends of the surface protective film were not completely adhered to the drum pad was evaluated as the case where the surface protective film was not attached to the drum pad any longer.

Adhesive Strength (Adhesive Strength C) Between Drum Pad and Base Layer after Lamination 50 Times Fifty surface protective films and one drum pad (DCTK, IMP 1P4-40SBL-S) were prepared. The process of attaching fifty different surface protective films to one drum pad and peeling off the fifty different surface protective films from the one drum pad was sequentially repeated 50 times. In this case, the second surface was attached to the drum pad using a 2 kg roller, and each surface protective film was peeled off from glass at a peel speed of 2 m/min and a peel angle of 180° using an apparatus (Texture Analyzer, manufactured by Stable Micro Systems, UK)). A peel strength when the 50th surface protective film was peeled off from the drum pad was indicated as Adhesive Strength C.

Adhesive Strength Maintenance Ratio

An adhesive strength maintenance ratio was calculated as follows.

Adhesive strength maintenance ratio (%)=Adhesive Strength $C$/Adhesive Strength $B$×100

TABLE 1

| | Example 1 | Example 2 | Example 3 | Example 4 | Comparative Example 1 | Comparative Example 2 |
|---|---|---|---|---|---|---|
| Adhesive Strength A (gf/in) | 4.5 | 4.2 | 4.2 | 4.2 | 3.63 | 3.5 |
| Adhesive Strength B (gf/in) | 3.68 | 3.35 | 3.37 | 3.25 | 3.63 | 3.2 |
| Adhesive Strength A-Adhesive Strength B (gf/in) | 0.82 | 0.85 | 0.83 | 0.95 | 0 | 0.3 |
| Determination of lamination | O | O | O | O | X | X |
| Water contact angle (°) | 83 | 87 | 89 | 90 | 72 | 71 |
| Number of drum pad laminations (times) | 1000 | 1200 | 2200 | 2200 | 250 | 480 |

TABLE 1-continued

|  | Example 1 | Example 2 | Example 3 | Example 4 | Comparative Example 1 | Comparative Example 2 |
|---|---|---|---|---|---|---|
| Adhesive Strength C (gf/in) | 3.42 | 3.18 | 3.3 | 3.19 | 2.2 | 1.86 |
| Adhesive strength maintenance ratio (%) | 93 | 95 | 98 | 98 | 60 | 58 |

From Table 1, it can be confirmed that in the surface protective film of the present invention, the difference between Adhesive Strengths A and B is 0.5 gf/in or more, and the surface protective film of the present invention is easily transferred from the drum pad to the organic light emitting element.

Further, it can be confirmed that in the surface protective film of the present invention, contamination of the drum pad is low due to the high water contact angle of the second surface, and the number of drum pad laminations is high, and deterioration in adhesive strength of the drum pad was low even though the attachment and detachment of the surface protective film is repeated.

The invention claimed is:

1. A surface protective film for drum roll lamination, comprising:
    a base layer sequentially comprising a first anti-static layer, a base film and a second anti-static layer; and
    an adhesive layer provided on a surface of the second anti-static layer, which is opposite to a surface on which the base film is provided,
    wherein the adhesive layer comprises a urethane based adhesive and satisfies the following Equation 1:

(Adhesive Strength $A$)−(Adhesive Strength $B$)>0.5 gf/in         <Equation 1> wherein, in the surface protective film, a surface of the adhesive layer opposite to the surface in contact with the base layer is defined as a first surface, and a surface of the base layer opposite to the surface in contact with the adhesive layer is defined as a second surface,
    Adhesive Strength A is defined as the peel strength measured by attaching the first surface of the surface protective film to alkali-free glass using a 2 kg roller, followed by peeling the film from the glass at 25° C., at a peel speed of 2 m/min, and at a peel angle of 180°; and
    Adhesive Strength B is defined as the peel strength measured by attaching the second surface of the surface protective film to a drum pad using a 2 kg roller, followed by peeling the film from the drum pad at 25° C., at a peel speed of 2 m/min, and at a peel angle of 180° wherein a water contact angle of the second surface is 80° or more.

2. The surface protective film for drum roll lamination of claim 1, wherein an adhesive strength maintenance ratio of the second surface, calculated by Equation 2, is 90% or more:

Adhesive strength maintenance ratio (%) of the second surface=(Adhesive Strength $C$)/(Adhesive Strength $B$)×100,         <Equation 2> wherein, in Equation 2, Adhesive Strength B is a peel strength when the second surface of the surface protective film is peeled off from a drum pad at 25° C., at a peel speed of 2m/min and a peel angle of 180° as defined above, and
    Adhesive Strength C is a peel strength when fifty surface protective films and one drum pad are prepared, a second surface of each of the fifty surface protective films is attached to the same site of the one drum pad, and the 50th surface protective film is peeled off from the drum pad when the process of peeling off the surface protective film at a peel speed of 2 m/min and a peel angle of 180° is sequentially repeated 50 times.

3. The surface protective film for drum roll lamination of claim 1, further comprising a protective layer sequentially comprising: a third anti-static layer; a protective film; and a fourth anti-static layer, wherein the adhesive layer is provided between the protective layer and the base layer.

4. The surface protective film for drum roll lamination of claim 3, wherein the protective layer further comprises a release layer provided on a surface of the third anti-static layer, which is opposite to a surface on which the protective film is provided.

* * * * *